United States Patent [19]

Kobayashi et al.

[11] Patent Number: 4,941,032

[45] Date of Patent: Jul. 10, 1990

[54] SEMICONDUCTOR DEVICE

[75] Inventors: Kenji Kobayashi; Masataka Kondo; Kazunori Tsuge; Yoshihisa Tawada, all of Kobe, Japan

[73] Assignee: Kanegafuchi Kagaku Kogyo Kabushiki Kaisha, Osaka, Japan

[21] Appl. No.: 298,279

[22] Filed: Jan. 13, 1989

Related U.S. Application Data

[63] Continuation of Ser. No. 21,039, Mar. 2, 1987, abandoned.

[30] Foreign Application Priority Data

Mar. 3, 1986 [JP] Japan .................. 61-47122

[51] Int. Cl.$^5$ .................... H01L 23/54; H01L 21/44
[52] U.S. Cl. ............................... 357/67; 357/2
[58] Field of Search .................. 357/67, 71, 2

[56] References Cited

U.S. PATENT DOCUMENTS

| | | | |
|---|---|---|---|
| 4,471,376 | 9/1984 | Morcom et al. | 357/67 |
| 4,527,184 | 7/1985 | Fischer | 357/67 |
| 4,561,009 | 12/1985 | Yonezawa et al. | 357/67 |
| 4,618,873 | 10/1986 | Sasano et al. | 357/2 |
| 4,694,317 | 9/1987 | Higashi et al. | 357/2 |

FOREIGN PATENT DOCUMENTS

| | | | |
|---|---|---|---|
| 59-104184 | 11/1982 | Japan . | |
| 58-178573 | 10/1983 | Japan | 357/2 |
| 60-30183 | 2/1985 | Japan . | |
| 60-239069 | 11/1985 | Japan | 357/2 |

OTHER PUBLICATIONS d'Heurle et al.—"Long-Life Aluminum Alloy Thin-Film Conductors"—IBM Technical Disclosure Bulletin—vol. 15, No. 1—6-1972—pp. 348-349.

*Primary Examiner*—Rolf Hille
*Assistant Examiner*—S. V. Clark
*Attorney, Agent, or Firm*—Armstrong, Nikaido, Marmelstein, Kubovcik & Murray

[57] ABSTRACT

A semiconductor device comprising an amorphous semiconductor which might contain microcrystal therein, and a metal electrode electrically connected to the amorphous semiconductor and containing Al as a first component; wherein at least one element selected from the group consisting of (i)Ag, (ii)Au, (iii)Ca, Mg, Mn, W, Cr or Cu, (iv)Zn or Ge, and (v)Fe, Mo, Ni, Pd, Pt, Ti, V or Zr is added, as an additional component of the metal electrode, to the first component. According the present invention, there can be prevented the diffusion of an element of a metal electrode into a semiconductor layer during the production and the use of a semiconductor device. Thereby, the degradation of properties of the semiconductor device can be substantially prevented. Further, the yield of products can be improved and the lifetime of products can be greatly lengthened.

17 Claims, No Drawings

SEMICONDUCTOR DEVICE

This application is a continuation of application Ser. No. 021,039 filed Mar. 2, 1987, now abandoned.

BACKGROUND OF THE INVENTION

The present invention relates to a semiconductor device, and more particularly to a semiconductor device wherein a material for a metal electrode which can improve heat resistance is used.

Conventional semiconductor devices such as amorphous silicon solar cells and pin type photosensors are produced by (1) forming a transparent conductive thin film comprising ITO, ITO/SnO$_2$, SnO$_2$, In$_2$O$_3$, Cd$_x$SnO$_y$ (wherein x and y satisfy the relationships of $0.5 \leq x \leq 2$ and $2 \leq y \leq 4$, respectively), Ir$_z$O$_{1-z}$ (wherein z satisfies the relationship of $0.33 \leq z \leq 0.5$), and the like on a translucent substrate such as a glass and plastic film by means of sputtering method, electron beam vacuum deposition method, thermal CVD method, spray method, and the like, (2) forming an amorphous silicon layer having a pin structure on the transparent conductive thin film, and then (3) providing a metal electrode comprising, for example, Al, Ag, Ni, and the like by means of resistance heating vacuum deposition method, electron beam vacuum deposition method, and the like using a mask.

The conditions required for the above-mentioned metal electrode are as follows:

(1) To have a low electric resistance in spite of being a thin film.

(2) Not to form a potential barrier between a metal electrode and a semiconductor layer, and therefore to have a good ohmic property.

(3) To have a high adhesive strength to a semiconductor layer.

(4) To have a high reflectivity when a semiconductor device is a solar cell or a photosensor.

(5) To have a thermal stability and be hard to be diffused into a semiconductor layer.

These conditions have significant influences on the characteristics and lifetime of semiconductor devices.

As a material for conventional metal electrodes, there have been generally used Al, Ag, Ni, and the like. Among these materials, Al has superior properties in a single metal material with respect to the above items (1) to (4). However, Al has a drawback that it is apt to diffuse into the semiconductor at a high temperature in case that an amorphous silicon is employed as a semiconductor. Accordingly, in case that an Al electrode is exposed to a relatively high temperature when an amorphous semiconductor which might contain microcrystals and has an Al electrode is produced, or in case that the temperature rises during the use of a semiconductor device, Al is easily diffused into the semiconductor to lower the properties of the semiconductors. Therefore, the manufacturing process of semiconductor devices is extremely limited, or the lifetime of semiconductor is extremely shortened. For example, in case of employing Al as a backside electrode of an amorphous silicon solar cell which is placed in the outdoors, the temperature of the backside electrode rises up to about 80° C. when it is irradiated by sunlight, whereby the performances of the solar cell are degraded.

The present invention was made to prevent the degradation of properties of semiconductor devices due to the diffusion of Al into the semiconductor, of which diffusion is generated (1) when an Al electrode is exposed to a relatively high temperature during a manufacturing process after the Al electrode is formed, in case that a amorphous semiconductor which might contain microcrystal and has an Al electrode is produced, or (2) when the temperature rises during the use of a semiconductor device.

SUMMARY OF THE INVENTION

In accordance with the present invention, there is provided a semiconductor device comprising an amorphous semiconductor which might contain microcrystals therein, and a metal electrode electrically connected to the amorphous semiconductor and containing Al as a first component; characterized in that at least one element selected from the group consisting of (i) Ag, (ii) Au, (iii) Ca, Mg, Mn, W, Cr or Cu, (iv) Zn or Ge, and (v) Fe, Mo, Ni, Pd, Pt, Ti, V or Zr is added, as an additional component of the metal electrode, to the first component.

DETAILED DESCRIPTION

As an amorphous semiconductor which might contain microcrystal therein used in the present invention, any semiconductor can be suitably used so long as it is a silicon amorphous semiconductor, or a silicon amorphous semiconductor which contains microcrystals therein. Concrete examples of such semiconductor include, for instance, a-Si:H, a-Si:F:H, a-Si:N:F:H, a-SiC:H, a-SiC:F:H, a-SiO:H, a-SiO:F:H, a-SiN:H, μc-Si:H, μc-Si:F:H, and the like. These semiconductors can be p-type, n-type, or intrinsic semiconductors.

As a material for a metal electrode employed in the present invention which is electrically connected to the amorphous semiconductor which might contain microcrystals therein, it is preferable to use an Al alloy containing Al as a first component and, in case of a binary alloy, an additional component particularly having such properties as described hereinafter from a viewpoint of improving the heat resistance of the obtained metal electrode.

(i) To form a primary solid solution with Al in a certain component range, which varies depending on the kind of element, when Al is rich, or form a homogeneous solid solution with Al in any component range, and to form an eutectic crystal with Si over the entire range of constitution.

(ii) Not to form a primary solid solution with Al at all, but to form an eutectic crystal with Si over the entire range of constitution.

(iii) To form a primary solid solution with Al in a certain component range, which varies depending on the kind of element, when Al is rich, or form a homogeneous solid solution with Al in any component range and form a silicide in a solid phase.

(iv) To form a primary solid solution with Al in a certain component range, which varies depending on the kind of element, when Al is rich, or form a homogeneous solid solution with Al in any component range, but not to form a silicide.

(v) Not to form a primary solid solution with Al, but to form a silicide.

It is preferable to use one or more kinds of elements having the above properties as an additional component.

Concrete examples of elements which satisfy the above itmes (i) to (v) include, for instance, (i) Ag, (ii) Au, (iii) Ca, Mg, Mn, W, Cr or Cu, (iv) Zn or Ge, and (v) Fe, Mo, Ni, Pd, Pt, Ti, V or Zr. Among these elements to be added to Al, (i) Ag, (ii) Au, (iii) Mg, Mn, W or Cr, (iv) Zn or Ge, and (v) Fe, Ni or Pd are preferable. In particular, (i) Ag, (iii) Mg, Mn, W or Cr, and (v) Ni or Pd are more preferable from a viewpoint of improving heat resistance or making the manufacturing process easy.

The proportion of these elements in the metal electrode is from 0.01 to 90 atm %, preferably from 0.1 to 25 atm %, and more preferably from 0.1 to 10 atm % in case of elements of the above item (i), and is from 0.01 to 90 atm %, preferably from 0.1 to 20 atm %, and more preferably from 0.1 to 10 atm % in case of the above items (ii) to (v). The heat resistance, adhesion strength, or reflectivity of the metal electrode can be particularly improved in the above preferable range.

In any case, the proportion of additional component is preferable from 0.1 to 50 atm % in order to sufficiently maintain an adhesive property of Al to Si.

In order to avoid the reduction of reflectivity and the increase of electric resistance of a metal electrode as much as possible and to improve the heat resistance the proportion of the above additional component element (except Au, Ag and Cu) is preferably not more than 10 atm %. Among additional component elements belonging to the above items (iii) and (iv), a proportion of Ca, Mg, Cu, Ge and the like of which melting point is lower than that of Si is preferably within a solid solution scope with Al at about 200° C., because the diffusion of Ca, Mg, Cu, Ge and the like into the semiconductor due to the heating cannot be sufficiently prevented if the proportion thereof is beyond a solid solution component with Al.

The above explanation relates to a binary system. However, the same effect as in a binary system can be obtained by suitably combining elements belonging to items (i) to (v), in case of a ternary system, quartenary system, and the like. When not less than two kinds of elements are added to Al, such elements might be selected from different groups respectively, or might be selected from the same group.

The thickness of a metal electrode is preferably from 20 to 100000 angstroms, more preferably from 40 to 5000 angstroms. In case that the thickness is not less than 40 angstroms, a superior uniformity of the film can be obtained. But, there cannot be expected an effect of increasing the thickness of the film over 500 angstroms, in spite of more film-forming time and cost.

The thickness of the metal electrode can be measured by using a quartz oscillator thickness monitor during a process of vacuum deposition, or can be measured by using a calibration curve based on the thickness obtained by means of a surface analysis such as SIMS.

The metal electrode is, in general, electrically connected to a p-type semiconductor layer, an n-type semiconductor layer, or both of p-type and n-type semiconductors.

It is preferable that the above-mentioned additional metals(i) to (v) exist in a uniform component in the electrode. However, there can be formed a plurality of layers having different component from each other in the electrode, according to circumstances. For example, a first layer comprising Al-Ag can be formed on an amorphous silicon semiconductor layer, and thereon a layer composing solely of Al or Ag can be formed as a second layer. In that case, the thickness of the first layer is preferably from about 20 to about 100 angstroms.

When a second electrode is formed on a semiconductor in such a manner that the semiconductor is sandwiched between the above metal electrode and the second electrode, representative examples of the second electrode are such electrodes as are composed of metal compound and the like comprising ITO, ITO/SnO$_2$, In$_2$O$_3$, Cd$_x$SnO$_y$ (wherein x and y satisfy the relationships of $0.5 \leq x \leq 2$ and $2 \leq y \leq 4$, respectively), Ir$_z$O$_{1-z}$ (wherein z satisfies the relationship of $0.33 \leq z \leq 0.5$), and the like. However, employable second electrodes are not limited to those described above.

In the present specification, "semiconductor device" means a solar cell, photosensor, photosensitive drum, thin film transistor, electroluminescent device, and the like having 0.01 to 100 μm of amorphous semiconductor which might contain microcrystals therein.

Next, there is explained a method of producing a semiconductor device of the present invention using, as an example, a solar cell wherein a p-type, i-type and n-type semiconductors are formed in this order from the side of light incidence.

First of all, on a transparent substrate whereon a transparent electrode is provided, there are formed, for example, layers of a p-type a-SiC:H, an i-type a-Si:H and an n-type μc-Si:H by means of plasma CVD method. Thereafter, a metal electrode having a predetermined thickness is formed on the n-type μc-Si:H layer by means of electron beam vacuum deposition method. As a source of vacuum deposition, there can be used such an Al alloy as provides a deposition having a predetermined component. The metal electrode can also be obtained by means of multi-electron beam method wherein beams are alternately irradiated to Al and other component elements to provide a deposition having a predetermined component. The metal electrode can be formed by sputtering an Al alloy target which provides a deposition having a predetermined component, or by co-sputtering Al and other component elements. Of course, the metal electrode can be formed by means of resistance heating vacuum deposition method using a vacuum deposition source comprising Al alloy, or by means of multi-vacuum deposition method. In forming a metal electrode, the temperature of the substrate whereon a p-type, i-type and n-type semiconductor layers are formed is from a room temperature to 300° C., preferably from a room temperature to 200° C.

Though the above explanation is based on the pin-type solar cell, the above production method and conditions can be preferably applied to a pi-type or pn-type solar cell, a tandem-type solar cell wherein at least one kind of the above semiconductors (i.e. pin-type, pi-type, or pn type semiconductors), and other kind of semiconductor devices. Further, though the above explanation is based on a heterojunction solar cell, the solar cell, of course, might be a homojunction solar cell.

The semiconductor device of the present invention produced in such a manner as described above maintains superior initial properties, and there is prevented the diffusion of an element constituting a metal electrode into a semiconductor layer, which diffusion is inherent in a semiconductor device having an Al electrode. Therefore, the device of the present invention is preferably employable in a solar cell, photosensor and the like which is (1) produced at a temperature of not less than 130° C., particularly not less than 150° C. after a metal electrode is formed on the semiconductor, or (2) used under the condition that the temperature of the metal electrode rises up to not less than 80° C. during the use thereof.

Next, there are explained Examples of semiconductor devices of the present invention.

EXAMPLE 1

On a glass substrate of 1.1 mm thick, fluorine doped $SnO_2$ of 4500 angstroms thick is deposited to form a transparent electrode. On the transparent electrode, (i) a gas mixture consisting of $SiH_4$, $CH_4$ and $B_2H_6$, (2) a gas mixture consisting of $SiH_4$ and $H_2$, and (3) a gas mixture consisting of $SiH_4$, $PH_3$ and $H_2$ are glow discharge decomposed in this order to form a p-type amorphous semiconductor layer of 150 angstroms thick, an i-type amorphous semiconductor layer of 7000 angstroms thick, and an n-type microcrystalline semiconductor layer of 300 angstroms thick, respectively, under the follwoing conditions.

Substrate temperature: about 200° C.
Pressure in a reaction. chamber : 0.5 to 1 Torr Thereafter, there is formed a metal electrode of 5000 angstroms thick comprising an alloy of Al and Ag (Al: 97 atm %, Ag: 3 atm %) by means of electron beam vacuum deposition method, maintaining the temperature of the substrate at 150° C.

There are measured the average properties of obtained fifty obtained solar cells, and average properties thereof after they are heated at 200° C. for six hours. The results are summarized in Table 1.

The properties of solar cells are measured under AM-1 illumination of 100 mW/cm² using a solar simulator.

EXAMPLE 2

Solar cells are produced in the same manner as in Example 1 except that an alloy of Al and Ag (Al : 75 atm %, Ag : 25 atm %) is used instead of an alloy of Al and Ag (Al : 97 atm %, Ag : 3 atm %) to form a metal electrode.

There are evaluated the average properties of obtained fifty obtained solar cells, and the average properties thereof after they are heated at 200° C. for six hours. The results are summarized in Table 1.

EXAMPLE 3

Solar cells are produced in the same manner as in Example 1 except that an alloy of Ag and Mg (Al : 99 atm %, Mg : 1 atm %) is used instead of an alloy of Al and Ag (Al : 97 atm %, Ag : 3 atm %) to form a metal electrode.

There are evaluated the average properties of fifty obtained solar cells, and the average properties thereof after they are heated at 200° C. for six hours. The results are summarized in Table 1.

COMPARATIVE EXAMPLE 1

Solar cells are produced in the same manner as in Example 1 except that Al is solely used instead of an alloy of Al; and Ag (Al : 97 atm %, Ag : 3 atm %) to form a metal electrode.

There are evaluated the average properties of fifty obtained solar cells, and the average properties thereof after they are heated at 230° C. for six hours. The results are summarized in Table 1.

EXAMPLES 4 to 6

Solar cells are produced in the same manner as in Example 1 except that an alloy of Al and Au (Al : 98 atm %, Au : 2 atm %) (Example 4), an aloy of Al and Zn (Al : 95 atm %, Zn : 5 atm %) (Example 5), and an alloy of Al and Ni (Al : 98 atm %, Ni : 2 atm %) (Example 6) are used respectively instead of an alloy of Al and Ag (Al; : 97 atm %, Agl : 3 atm %) to form metal electrodes.

There are carried out the heating test with respect to two obtained solar cells respectively. In each Example, the conversion efficiency after heating is maintained to such an extent of not less than 80 % of that before heating. The results are summarized in Table 1.

TABLE 1

| | Solar cell property after the production | | | | solar cell property after heating for six hours | | | | Heating temperature (°C.) |
|---|---|---|---|---|---|---|---|---|---|
| | Jsc (mA/cm²) | Voc (v) | FF (%) | η (%) | Jsc (mA/cm²) | Voc (v) | FF (%) | η (%) | |
| Ex. 1 | 15.7 | 0.90 | 64.5 | 9.1 | 15.2 | 0.90 | 64.5 | 8.8 | 200 |
| Ex. 2 | 15.7 | 0.90 | 64.0 | 9.0 | 15.3 | 0.90 | 64.0 | 8.8 | 200 |
| Ex. 3 | 15.3 | 0.89 | 63.5 | 8.6 | 15.0 | 0.88 | 63.5 | 8.4 | 200 |
| Ex. 4 | 15.4 | 0.90 | 63.1 | 8.7 | 15.0 | 0.90 | 62.9 | 8.5 | 200 |
| Ex. 5 | 15.1 | 0.88 | 62.8 | 8.3 | 14.8 | 0.88 | 62.5 | 8.1 | 200 |
| Ex. 6 | 15.5 | 0.90 | 63.7 | 8.9 | 15.1 | 0.90 | 63.6 | 8.6 | 200 |
| Com. Ex. 1 | 15.9 | 0.90 | 65.0 | 9.3 | 10.3 | 0.36 | 42.3 | 1.6 | 200 |

As is explained hereinbefore, in a semiconductor device of the present invention, there can be prevented the diffusion of a metal constituting a metal electrode into a semiconductor layer in case that the semiconductor device is exposed to a relatively high temperature, for example ,when the semiconductor device is produced or when it is used, by forming a metal electrode (which is electrically connected to an amorphous semiconductor which might contain microcystal) consisting of Al as a first component and additional component added to the first component comprising at least one element selected from the group consisting of Ag, Au, Ca, Mg, Mn, W. Cr, Cu, Zn, Ge, Fe, Mo, Ni, Pd, Pt, Ti, V and Zr. Thereby, the degradation of properties of the semiconductor device can be substantially prevented. Further, the yield of products can be improved and the lifetime of products can be greatly lengthened.

What is claimed is:

1. A semiconductor device comprising an amorphous semiconductor which might contain microcrystals therein, and a metal electrode directly in contact with said amorphous semiconductor, wherein said metal electrode consists essentially of Al as a first component, and at least one additional component selected from the group consisting of (i) Ag, (ii) Au, (iii) Ca, Mg, Mn, W, Cr or Cu, (iv) Zn or Ge, and (v) Fe, Mo, Ni, Pd, Pt, Ti, V or Zr.

2. The semiconductor device of claim 1, wherein the additional component of the metal electrode is at least one element selected from the group consisting of (i)Ag, (ii)Au, and (iii)Ca, Mg, Mn, W, Cr or Cu.

3. The semiconductor device of claim 1, wherein the additional component of the metal electrode is at least one element selected from the group consisting of (i)Ag, (iii)Mg, Mn or Cr, (iv)Zn or Ge, and (v)Fe, Ni or Pd.

4. The semiconductor device of claim 1, wherein the content of the additional component of the metal electrode is from 0.01 to 90 atm %.

5. The semiconductor device of claim 1, wherein the content of the additional component of the metal electrode is from 0.10 to 25 atm % in the case of Ag, and is from 0.10 to 20 atm % in the case of elements other than Ag.

6. The semiconductor device of any one of claims 1 to 5, wherein the thickness of the metal electrode is from 20 to 100000 angstroms.

7. The semiconductor device of claim 1, wherein the thickness of the amorphous semiconductor which might contain microcrystals is from 0.01 to 100 μm.

8. The semiconductor device of any one of claims 1 or 7, wherein the amorphous semiconductor which might contain microcrystal is a semiconductor selected from the group consisting of a pin-type semiconductor, a pi-type semiconductor, a pn-type semiconductor and a laminated semiconductor composed of semiconductor selected from at least one kind of pin-type, pi-type and pn-type semiconductors.

9. The semiconductor device of any one of claims 1 to 5, wherein the metal electrode is electrically connected to a p-type semiconductor, an n-type semiconductor, or both of p-type and n-type semiconductors.

10. The semiconductor device of claim 1, wherein (i) the proportion of Ag is 0.1 to 25 atm %, (iii) the proportion of Cr is 0.1 to 12 atm % and the proportion of Mg, Mn or W is 0.1 to 20 atm %, and (v) the proportion of Fe, Ni or Pd is 0.1 to 20 atm %, and the thickness of the metal electrode is 50 to 5000 angstorms.

11. The semicondcutor device of claim 1, wherein (i) the proportion of Ag is 0.1 to 25 atm %, (iii) the proportion of Cr is 0.1 to 12 atm % and the proportion of Mg, Mn or W is 0.1 to 20 atm %, and (v) the proportion of Fe, Ni or Pd is 0.1 to 20 atm %, and the metal electrode has a double layer construction of Al-alloy/meal wherein the thickness of Al-alloy is 20 to 100 angstroms.

12. The semiconductor device of claim 11, wherein the thickness of the metal is 500 to 5000 angstroms.

13. The semiconductor device of claim 11, wherein the metal is Al or Ag.

14. A solar cell comprising the semiconductor device of claim 1.

15. A solar cell comprising the semiconductor device of claim 8.

16. A photosensor comprising the semiconductor device of claim 1.

17. A photosensor comprising the semiconductor of claim 8.

* * * * *